(12) United States Patent
Kim et al.

(10) Patent No.: US 10,665,785 B2
(45) Date of Patent: May 26, 2020

(54) MASK FOR DEPOSITION AND METHOD OF MANUFACTURING THE SAME

(71) Applicant: SAMSUNG DISPLAY CO., LTD., Yongin-si, Gyeonggi-do (KR)

(72) Inventors: Youngdae Kim, Yongin-si (KR); Sangjin Park, Yongin-si (KR); Minjae Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 207 days.

(21) Appl. No.: 15/864,472

(22) Filed: Jan. 8, 2018

(65) Prior Publication Data

US 2019/0027686 A1 Jan. 24, 2019

(30) Foreign Application Priority Data

Jul. 20, 2017 (KR) .................. 10-2017-0092258

(51) Int. Cl.
*G03F 7/20* (2006.01)
*C23C 14/04* (2006.01)
(Continued)

(52) U.S. Cl.
CPC ........ *H01L 51/0011* (2013.01); *C23C 14/042* (2013.01); *G03F 7/038* (2013.01); *G03F 7/039* (2013.01); *G03F 7/094* (2013.01); *G03F 7/095* (2013.01); *G03F 7/0957* (2013.01); *G03F 7/12* (2013.01); *G03F 7/2022* (2013.01); *G03F 7/213* (2013.01); *G03F 7/26* (2013.01); *H01L 51/56* (2013.01)

(58) Field of Classification Search
CPC ... C23C 14/042; H01L 51/0011; H01L 51/56; G03F 7/2022
USPC .................................... 430/320; 216/11, 12
See application file for complete search history.

(56) References Cited

U.S. PATENT DOCUMENTS 4,755,257 A * 7/1988 Yamamoto ................ C23F 1/02
216/12
8,815,015 B2 8/2014 Kobayashi
(Continued)

FOREIGN PATENT DOCUMENTS

KR 10-2005-0083421 A 8/2005
KR 10-2009-0021098 A 2/2009
(Continued)

*Primary Examiner* — John A McPherson
(74) *Attorney, Agent, or Firm* — Lewis Roca Rothgerber Christie LLP (57) ABSTRACT

A method of manufacturing a mask includes attaching a first mask base substrate and a second mask base substrate to opposite sides of an adhesive layer, forming a photoresist layer on the first and second mask base substrates, exposing and developing the photoresist layer to remove the photoresist layer on effective area at centers of surfaces of the first and second mask base substrates such that the first photoresist layer remains on non-effective areas at edges of surfaces of the first mask base substrate and the second mask base substrate, etching the effective area to form a stepped groove on the first and second mask base substrates, separating the first and second mask base substrates from the adhesive layer, and forming a pattern hole in the effective area of first and second mask base substrates, each with the first stepped groove thereon.

20 Claims, 7 Drawing Sheets

(51) Int. Cl.
*H01L 51/00* (2006.01)
*H01L 51/56* (2006.01)
*G03F 7/039* (2006.01)
*G03F 7/038* (2006.01)
*G03F 7/26* (2006.01)
*G03F 7/09* (2006.01)
*G03F 7/095* (2006.01)
*G03F 7/213* (2006.01)
*G03F 7/12* (2006.01)

(56) References Cited

U.S. PATENT DOCUMENTS

2014/0356769 A1   12/2014  Prushinskiy et al.
2016/0144393 A1*  5/2016  Kwon ........................ G03F 7/40
                                                118/504
2019/0259950 A1*  8/2019  Jung ........................ C22C 38/08

FOREIGN PATENT DOCUMENTS

| KR | 10-2009-0119147 A | 11/2009 |
| KR | 10-2014-0140865 A | 12/2014 |
| KR | 10-1786391 B1 * | 11/2017 |

* cited by examiner

MASK FOR DEPOSITION AND METHOD OF MANUFACTURING THE SAME

CROSS-REFERENCE TO RELATED APPLICATION

Korean Patent Application No. 10-2017-0092258, filed on Jul. 20, 2017, in the Korean Intellectual Property Office, and entitled: "Mask for Deposition and Method of Manufacturing the Same," is incorporated by reference herein in its entirety.

BACKGROUND

1. Field

One or more embodiments relate to a mask for deposition and a method of manufacturing the same.

2. Description of the Related Art

Organic light emitting devices are type of a self-emission device, have a wide viewing angle, a high contrast ratio, a short response speed, and excellent brightness, driving voltage, and response rate characteristics, and produce multicolor images.

Organic light emitting devices may each have a structure in which a first electrode, an organic layer, and a second electrode are sequentially stacked in this stated order on a substrate. This stacked structure of such organic light emitting devices may be formed by a deposition method using a mask. For example, a fine pattern of the organic layer may be formed by using a deposition method using a metal mask such as a fine metal mask (FMM). However, since there are no needs for a fine pattern in the first electrode and the second electrode, a deposition method for forming the first mask and the second mask may be formed by using an open mask.

SUMMARY

Embodiments are directed to a method of manufacturing a mask for deposition including attaching a bottom surface of a first mask base substrate to a top surface of an adhesive layer and attaching a top surface of a second mask base substrate to a bottom surface of the adhesive layer, forming a first photoresist layer on a top surface of the first mask base substrate and on a bottom surface of the second mask base substrate, exposing and developing the first photoresist layer to remove a portion of the first photoresist layer on an effective area located in a center of the top surface of the first mask base substrate and in a center of the bottom surface of the second mask base substrate, while allowing a portion of the first photoresist layer on a non-effective area at an edge of the top surface of the first mask base substrate and at an edge of the bottom surface of the second mask base substrate to remain, etching the effective area to form a first stepped groove on the top surface of the first mask base substrate and on the bottom surface of the second mask base substrate, removing the portion of the first photoresist layer remaining on the non-effective area, separating the first mask base substrate and the second mask base substrate from the adhesive layer, and forming a pattern hole in the effective area of each of the first mask base substrate and the second mask base substrate, each with the first stepped groove thereon.

The adhesive layer may include at least one selected from a resin adhesive, a resin-free adhesive, a silicone adhesive, an acrylic adhesive, a plastic adhesive, a natural adhesive, a water-based adhesive, and a waterproof adhesive.

The first photoresist layer may include a positive-type photoresist. Exposing the first photoresist layer may include arranging a first photomask over the first photoresist layer, wherein the first photomask has an opening corresponding to the effective area of each of the first mask base substrate and the second mask base substrate, and irradiating light toward each of the first mask base substrate and the second mask base substrate through the opening of the first photomask, such that light passing through the opening of the first photomask is irradiated onto the first photoresist layer on the effective area of each of the top surface of the first mask base substrate and the bottom surface of the second mask base substrate, and light traveling toward the first photoresist layer located on the non-effective area of each of the top surface of the first mask base substrate and the bottom surface of the second mask base substrate is shielded by the first photomask.

The first photoresist layer may include a negative-type photoresist. Exposing the first photoresist layer may include arranging a first photomask over the first photoresist layer such that the first photomask has an opening corresponding to the non-effective area of each of the first mask base substrate and the second mask base substrate, and irradiating light toward each of the first mask base substrate and the second mask base substrate through the first photomask, such that light passing through the opening of the first photomask is irradiated onto the first photoresist layer located on the non-effective area of each of the top surface of the first mask base substrate and the bottom surface of the second mask base substrate, and light traveling toward the first photoresist layer located on the effective area of each of the top surface of the first mask base substrate and the bottom surface of the second mask base substrate is shielded by the first photomask.

The pattern hole may be formed by wet-etching or by irradiating with a laser beam.

A thickness of the effective area of each of the first mask base substrate and the second mask base substrate, each with the first stepped groove thereon, may be in a range of about 5 μm to about 20 μm. A thickness of the non-effective area of each of the first mask base substrate and the second mask base substrate may be in a range of about 20 μm to about 50 μm.

Embodiments are also directed to a method of manufacturing a mask for deposition including attaching a bottom surface of a first mask base substrate onto a top surface of an adhesive layer and attaching a top surface of a second mask base substrate onto a bottom surface of the adhesive layer, forming a first photoresist layer on each of a top surface of the first mask base substrate and a bottom surface of the second mask base substrate, exposing and developing the first photoresist layer to remove a portion of the first photoresist layer on an effective area located in a center of each of the top surface of the first mask base substrate and the bottom surface of the second mask base substrate, while allowing a portion of the first photoresist layer on a non-effective area, other than the effective area, to remain near an edge of each of the top surface of the first mask base substrate and the bottom surface of the second mask base substrate, etching the effective area to form a first stepped groove in each of the top surface of the first mask base substrate and the bottom surface of the second mask base substrate, removing the portion of the first photoresist layer remaining on the non-effective area, separating the first mask base substrate and the second mask base substrate from the adhesive layer, forming a second photoresist layer on each of the bottom surface of the first mask base substrate and the top surface of the second mask base substrate, exposing and developing the second photoresist layer to remove a portion of the second photoresist layer on an effective area located in a center of each of the bottom surface of the first mask base substrate and the top surface of the second mask base substrate, while allowing a portion of the second photoresist layer on a non-effective area, other than the effective area, to remain near an edge of the bottom surface of the first mask base substrate and the top surface of the second mask base substrate, etching the effective area to form a second stepped groove on each of the bottom surface of the first mask base substrate and the top surface of the second mask base substrate, removing the portion of the second photoresist layer remaining on the non-effective area, and forming a pattern hole in the effective area of each of the first mask base substrate having the first stepped groove thereon and the second mask base substrate having the second stepped groove thereon.

The adhesive layer may include at least one selected from a resin adhesive, a resin-free adhesive, a silicone adhesive, an acrylic adhesive, a plastic adhesive, a natural adhesive, a water-based adhesive, and a waterproof adhesive.

The first photoresist layer may include a positive-type photoresist. Exposing the first photoresist layer may include arranging a first photomask over the first photoresist layer, such that the first photomask has an opening corresponding to the effective area of each of the first mask base substrate and the second mask base substrate, and irradiating light toward each of the first mask base substrate and the second mask base substrate through the first photomask, wherein light passing through the opening of the first photomask is irradiated onto the first photoresist layer on the effective area of each of the top surface of the first mask base substrate and the bottom surface of the second mask base substrate, and light traveling toward the first photoresist layer on the non-effective area of each of the top surface of the first mask base substrate and the bottom surface of the second mask base substrate is shielded by the first photomask.

The first photoresist layer may include a negative-type photoresist. Exposing the first photoresist layer may include arranging a first photomask over the first photoresist layer, such that the first photomask has an opening corresponding to the non-effective area of each of the first mask base substrate and the second mask base substrate, and irradiating light toward the first mask base substrate and the second mask base substrate through the first photomask, such that light passing through the opening of the first photomask is irradiated onto the first photoresist layer on the non-effective area of each of the top surface of the first mask base substrate and the bottom surface of the second mask base substrate, and light traveling toward the first photoresist layer on the effective area of each of the top surface of the first mask base substrate and the bottom surface of the second mask base substrate is shielded by the first photomask.

The pattern hole may be formed by wet-etching or by irradiating with a laser beam.

A thickness of the effective area of each of the first mask base substrate and the second mask base substrate, each with the first stepped groove and the second stepped groove thereon, may be in a range of about 5 μm to about 20 μm. A thickness of the non-effective area of each of the first mask base substrate and the second mask base substrate is in a range of about 20 μm to about 50 μm.

Embodiments are also directed to a mask for deposition, including a pattern portion including a plurality of pattern holes through which a deposition material is passable and a supporting portion extending outwardly from facing sides of the pattern portion. The supporting portion includes a reinforcing portion protruding at least one of upward and downward with respect to a plane formed by top and bottom surfaces of the pattern portion.

A thickness of the supporting portion may be greater than a thickness of the pattern portion.

A thickness of the pattern portion may be in a range from about 5 μm to about 20 μm.

A thickness of the supporting portion may be in a range from about 20 μm to about 50 μm.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When a certain embodiment may be implemented differently, a specific process order may be performed differently from the described order. For example, two consecutively described processes may be performed substantially at the same time or performed in an order opposite to the described order.

FIGS. 1 to 9 illustrate conceptual diagrams for explaining a method of manufacturing a mask for deposition according to an embodiment.

Figure 1:
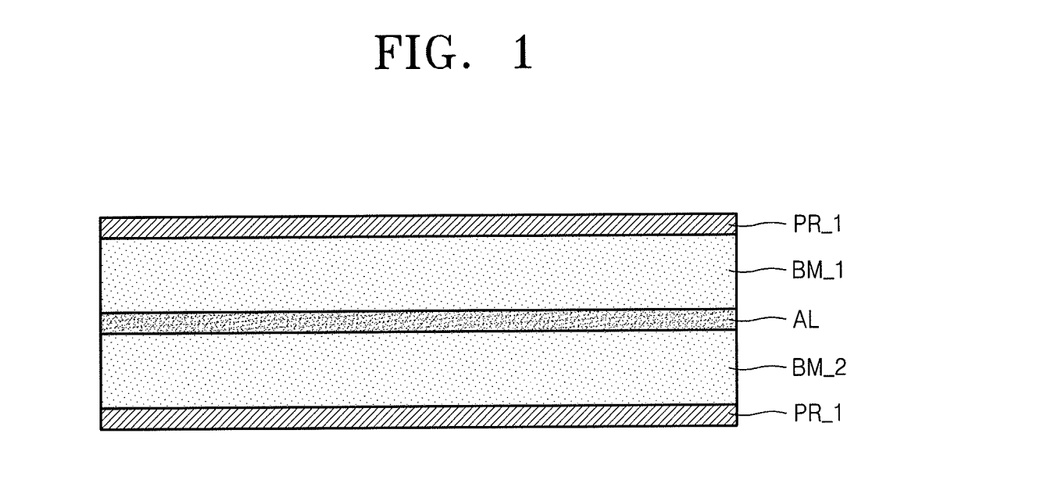
FIGS. 1 to 9 illustrate conceptual diagrams for explaining a method of manufacturing a mask for deposition according to an embodiment.

Referring to FIG. 1, a first mask base substrate BM_1, a second mask base substrate BM_2, and an adhesive layer AL may be prepared. A bottom surface of the first mask base substrate BM_1 may be attached onto a top surface of the adhesive layer AL, and a top surface of the second mask base substrate BM_2 may be attached onto a bottom surface of the adhesive layer AL. A first photoresist layer PR_1 may be formed on a top surface of the first mask base substrate BM_1 and on a bottom surface of the second mask base substrate BM_2.

The adhesive layer AL may include at least one selected from a resin adhesive, a resin-free adhesive, a silicone adhesive, an acrylic adhesive, a plastic adhesive, a natural adhesive, a water-based adhesive, and a waterproof adhesive. For example, a resin adhesive may be used to attach the first mask base substrate BM_1 and the second mask base substrate BM_2 to each other.

The first photoresist layer PR_1 may be a positive-type photoresist layer or a negative-type photoresist layer. The first photoresist layer PR_1 may be formed on the top surface of the first mask base substrate BM_1 and on the bottom surface of the second mask base substrate BM_2. As will be described below, when the first photoresist layer PR_1 is a positive-type photoresist layer, the first photoresist layer PR_1 may be removed by etching a light-exposure region in a developing process When the first photoresist layer PR_1 is a negative-type photoresist layer, the first photoresist layer PR_1 may be removed by etching a remaining region, excluding the light-exposure region. For example, when the first photoresist layer PR_1 is a negative-type photoresist layer, the region of the first photoresist layer PR_1 that has not been exposed to light may be removed and the portion of the first photoresist layer PR_1 that has been exposed to light may remain.

Hereinafter, the expression "first" in the first photoresist layer PR_1 is used to distinguish photoresist layers newly used in distinguishing processes of a method of manufacturing a mask for deposition described below. The "first, second, third, and fourth photoresist layers" used herein are identical photoresist layers and include identical materials. For example, the "first, second, third, and fourth photoresist layers" are elements including the "same material" used in "processes that are differentiated from each other." Accordingly, substantially, the "first, second, third, and fourth photoresist layers may all refer to "an identical photoresist layer."

In the case of the method of manufacturing a mask for deposition according to embodiments described with reference to FIGS. 2 and 3, the first photoresist layer PR_1 used herein may be a positive type photoresist layer. An exposed region of the first photoresist layer PR_1 may be etched away in the following development process. Hereinafter, for convenience of explanation, the description will be made with reference to embodiments by using the first photoresist layer PR_1 and the second photoresist layer PR_2, each being a positive-type photoresist layer.

Figure 2:
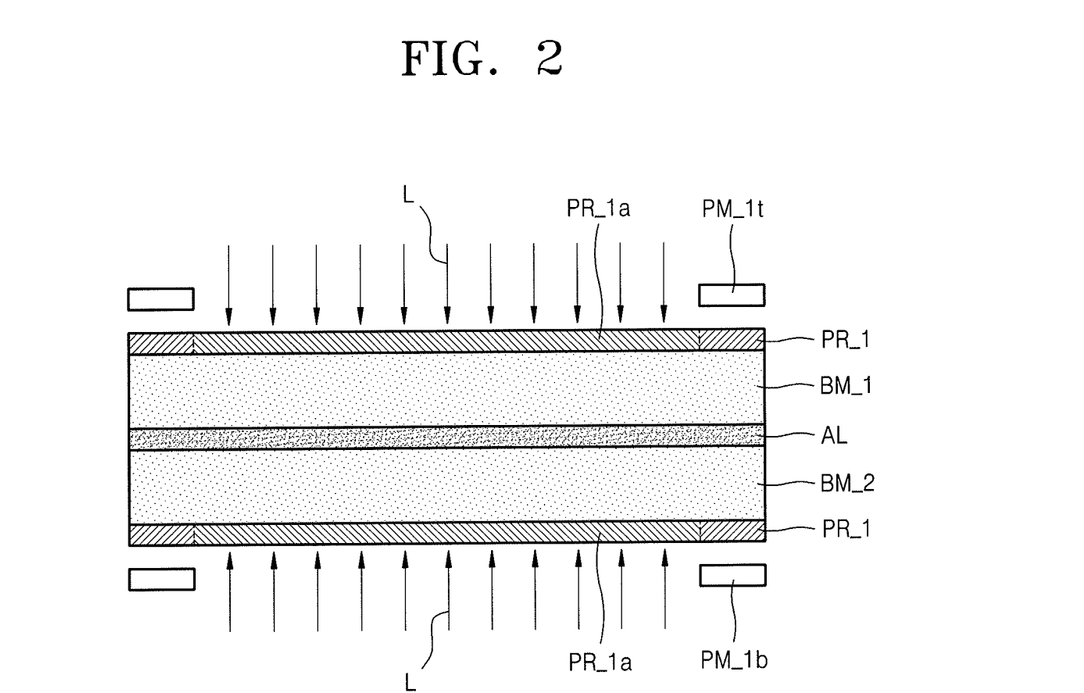
Figure 3:
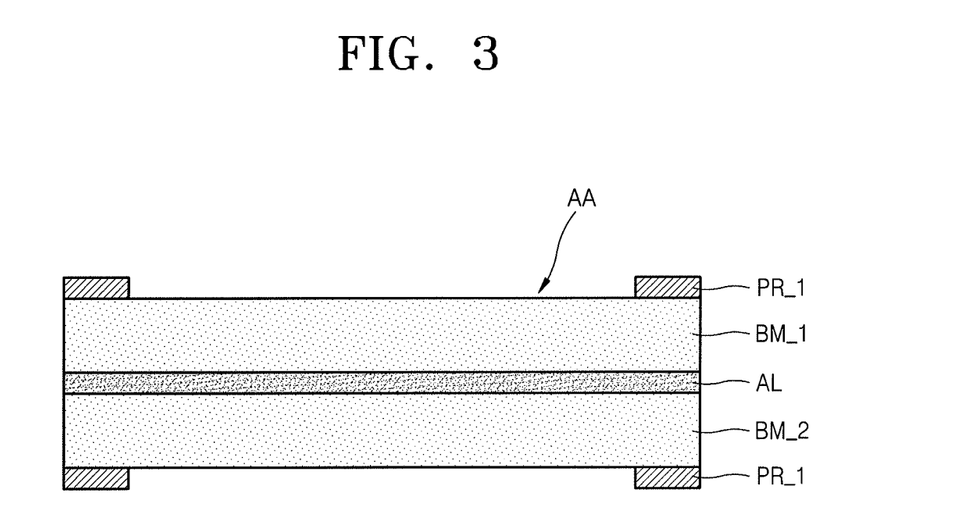

Referring to FIG. 2, after the first photoresist layer PR_1 is formed on each of the top surface of the first mask base substrate BM_1 and the bottom surface of the second mask base substrate BM_2, an exposure process may be performed on the first photoresist layer PR_1. For example, in the exposure process on the first photoresist layer PR_1, a first photomask PM_1t or PM_1b may be located over the first photoresist layer PR_1. The first photomask PM_1t or PM_1b may have an opening corresponding to an effective area AA of each of the first mask base substrate BM_1 and the second mask base substrate BM_2. The effective area AA may be an area located near the center of the top surface of the first mask base substrate BM_1 and the bottom surface of the second mask base substrate BM_2. In the effective area AA, a pattern hole (see PH of FIG. 9) may be formed. The pattern hole will be described below.

While the first photomask PM_1t or PM_1b having an opening is located over the first photoresist layer PR_1, light L may be irradiated toward the first mask base substrate BM_1 and toward the second mask base substrate BM_2 in such a way that light passes through the opening of the first photomask PM_1t and passes through the opening of the second photomask PM_1b. The light that has passed through the opening of the first photomask PM_1t or PM_1b may be irradiated onto a portion of the first photoresist layer PR_1 that corresponds to the effective area AA of each of the top surface of the first mask base substrate BM_1 and the bottom surface of the second mask base substrate BM_2, The light that travels toward a portion of the first photoresist layer PR_1 corresponding to a non-effective area (see NA of FIG. 4) of each of the top surface of the first mask base substrate BM_1 and the bottom surface of second mask base substrate BM_2 may be shielded by the first photomask PM_1t or PM_1b.

A first development area PR_1a of the first photoresist layer PR_1, which has been exposed, may be removed by a developing process. For example, through the development process, the effective area AA of each of the top surface of the first mask base substrate BM_1 and the bottom surface of the second mask base substrate BM_2 may be exposed to the outside, illustrated in FIG. 3. On the other hand, as also illustrated in FIG. 3, the unexposed portion of the first photoresist layer PR_1 may remain on the non-effective area NA of each of the top surface of the first mask base substrate BM_1 and the bottom surface of the second mask base substrate BM_2.

Figure 4:
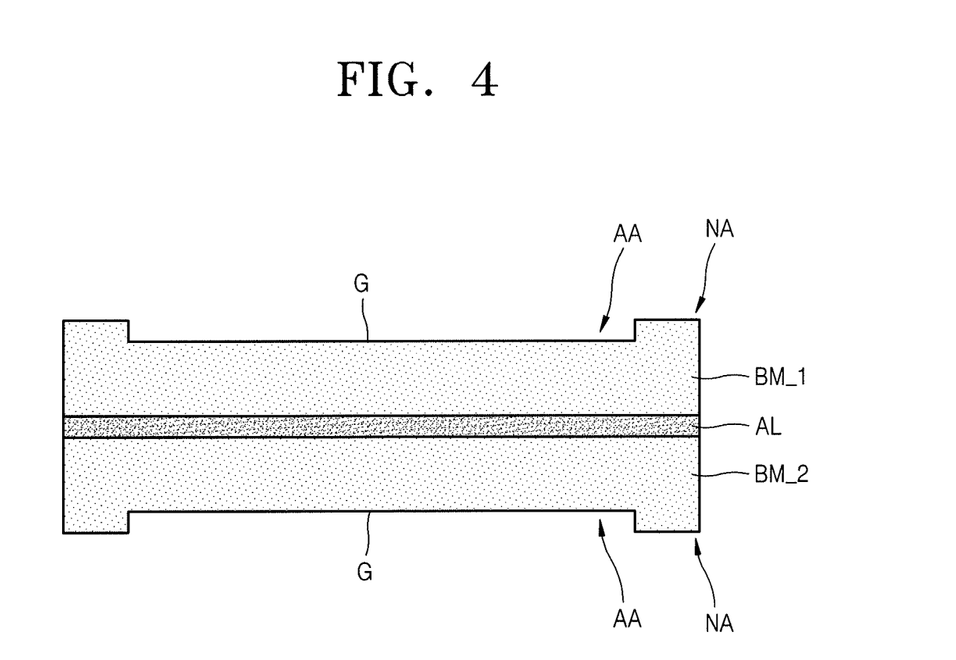

Referring to FIG. 4, a first stepped groove G may be formed on each of the top surface of the first mask base substrate BM_1 and the bottom surface of the second mask base substrate BM_2 by etching the effective area AA. The first photoresist layer PR_1 remaining on the non-effective area NA may be removed.

Figure 5:
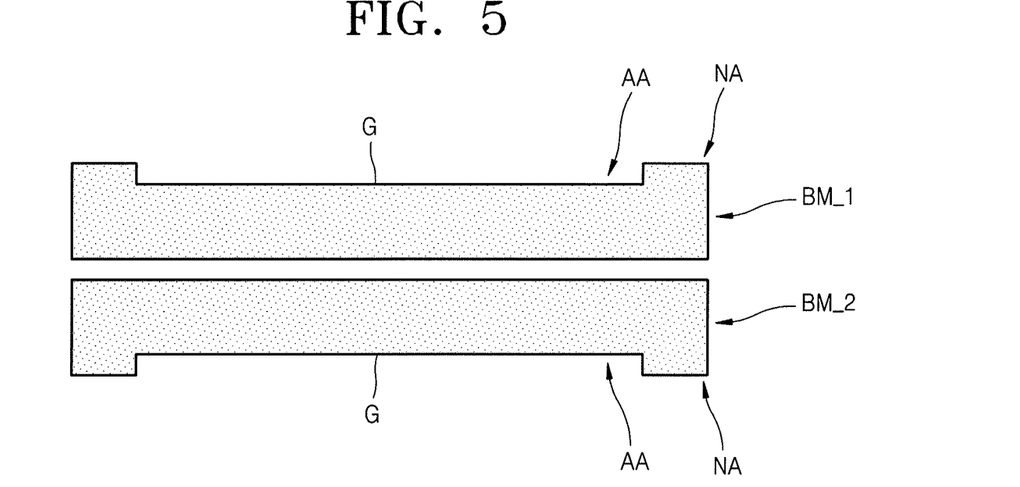

Referring to FIG. 5, the first mask base substrate BM_1 and the second mask base substrate BM_2 may be separated from the adhesive layer AL.

As described above, in a method of manufacturing a mask for deposition according to an embodiment, by performing an etching process once, the first stepped groove G may be formed on the effective area AA of each of the first mask base substrate BM_1 and the second mask base substrate BM_2. Such a method may provide higher productivity with respect to a method of manufacturing the mask for deposition.

Next, FIGS. 6 to 9 sequentially illustrate a process of forming a pattern hole PH in the effective area AA of the first mask base substrate BM_1 with the first stepped groove G thereon. It is to be understood that the pattern hole PH may also be formed in the second mask base substrate BM_2. The first mask base substrate BM_1 and the second mask base substrate BM_2 may actually be the same mask base substrate, and the process for forming the pattern hole PH in the second mask base substrate BM_2 may be substantially the same as the process for forming the pattern hole PH in the first mask base substrate BM_1. Accordingly, hereinafter, only the process for forming the pattern hole PH in the first mask base substrate BM_1 will be described in detail.

FIGS. 6 to 9 sequentially illustrate the process of forming the pattern hole PH by wet-etching. However, this process is an example. For example, the pattern hole PH may be formed by, in addition to wet etching, irradiating a laser beam to the effective area AA of the first mask base substrate BM_1.

The process of forming the pattern hole PH in the effective area AA of the first mask base substrate BM_1 with the first stepped groove G thereon will now be described in detail.

Figure 6:
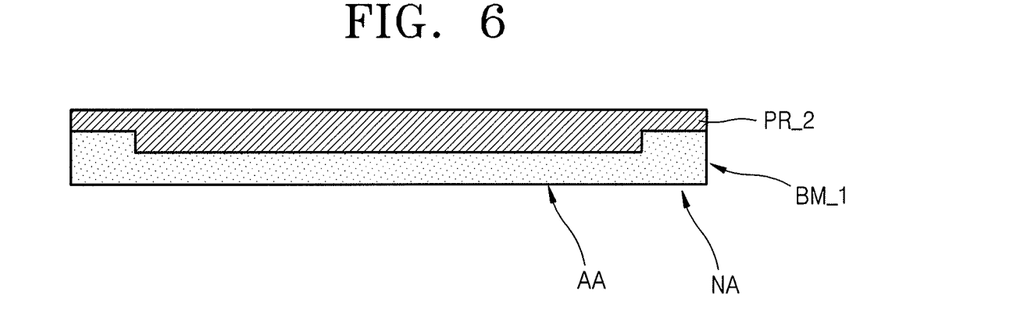

Referring to FIG. 6, a second photoresist layer PR_2 may be formed on the entire top surface, for example, the effective area AA and the non-effective area NA, of the first mask base substrate BM_1 with the first stepped groove G thereon.

Figure 7:
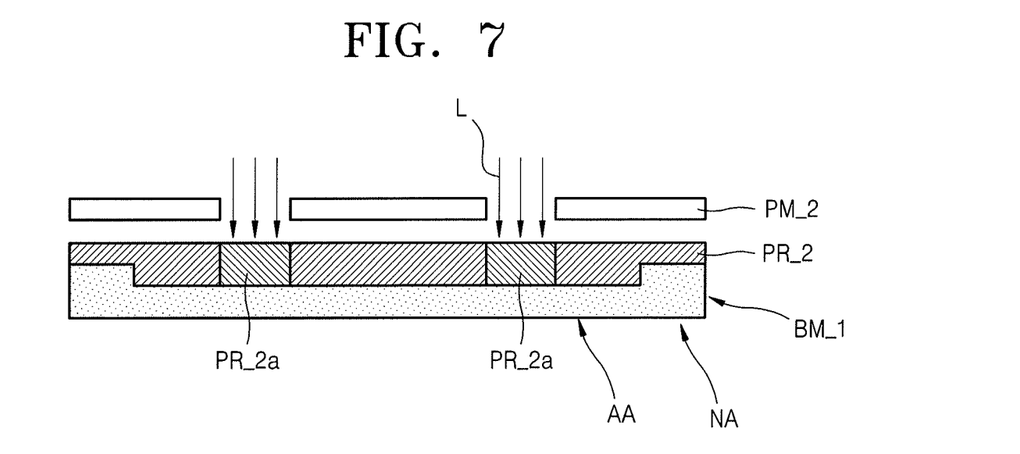

Referring to FIG. 7, the second photomask PM_2 may be arranged over the second photoresist layer PR_2. The second photomask PM_2 may include an opening corresponding to an etching region of the second photoresist layer PR_2 where the pattern hole PH is to be formed. For convenience of description, the second photomask PM_2 is shown in FIG. 7 as having two openings. According to various implementations, the second photomask PM_2 may have a number of openings corresponding to the number of pattern holes to be formed.

After the second photomask PM_2 is arranged over the second photoresist layer PR_2, light may be irradiated to a second development area PR_2a of the second photoresist layer PR_2 through the openings of the second photomask PM_2.

Figure 8:
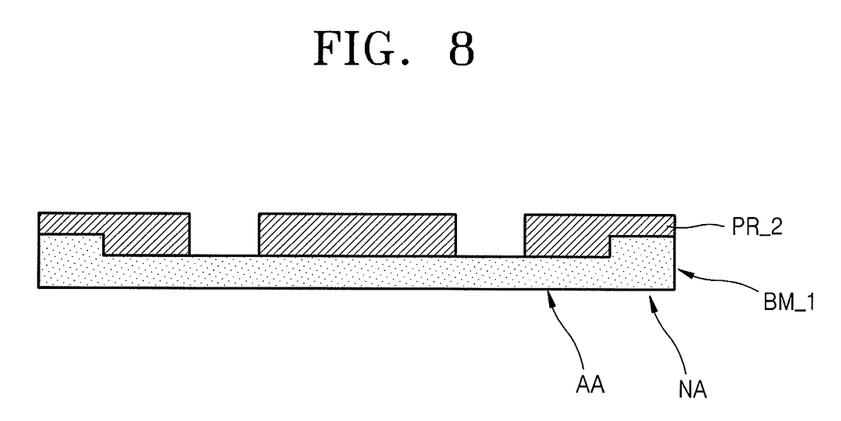

Referring to FIG. 8, the second development area PR_2a of the second photoresist layer PR_2, which has been exposed, may be removed by a developing process.

Figure 9:
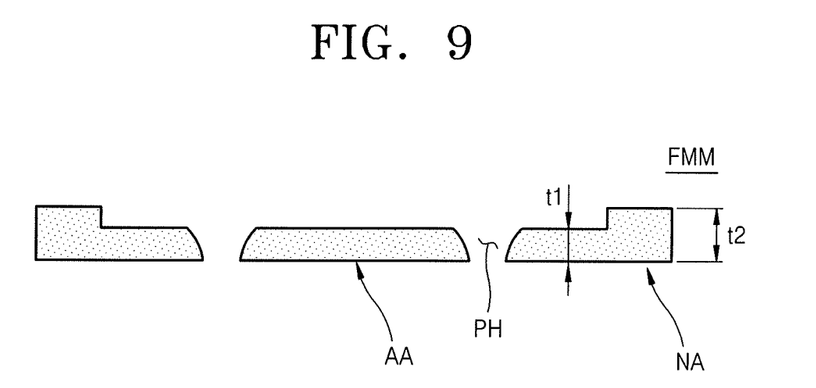

Referring to FIG. 9, the pattern hole PH may be formed in the first mask base substrate BM_1 by wet etching, and the second photoresist layer PR_2 may then be removed.

According to the method of manufacturing a mask for deposition according to the embodiment described above, a mask for deposition FMM including the effective area AA having a first thickness t1 and the non-effective area NA having a second thickness t2 may be formed. The thickness of the effective area AA of the first mask base substrate BM_1 with the first stepped groove G thereon may be in a range of about 5 μm to about 20 μm. The thickness of the non-effective area NA of the first mask base substrate BM_1 may be in a range of about 20 μm to about 50 μm.

For example, the effective area AA of the mask for deposition FMM in which the pattern hole PH, through which a deposition material passes during a deposition process, is formed to have a smaller thickness such that a high-quality display may be realized and a shadow phenomenon may be reduced\. The non-effective area NA of the mask for deposition may be formed to have a greater thickness than the effective area AA to ensure mechanical strength when the mask for deposition is welded onto a frame.

FIGS. 10 to 17 illustrate conceptual diagrams for explaining a method of manufacturing a mask for deposition according to another embodiment.

The first mask base substrate BM_1 shown in FIG. 10 may be the same element as the first mask base substrate BM_1 or the second mask base substrate BM_2 obtained according to the method of manufacturing the mask for deposition explained in connection with FIGS. 1 to 5.

Figure 12:
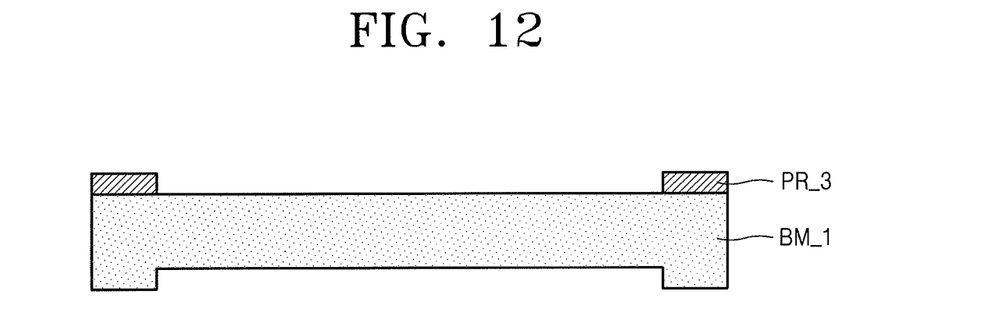
Figure 13:
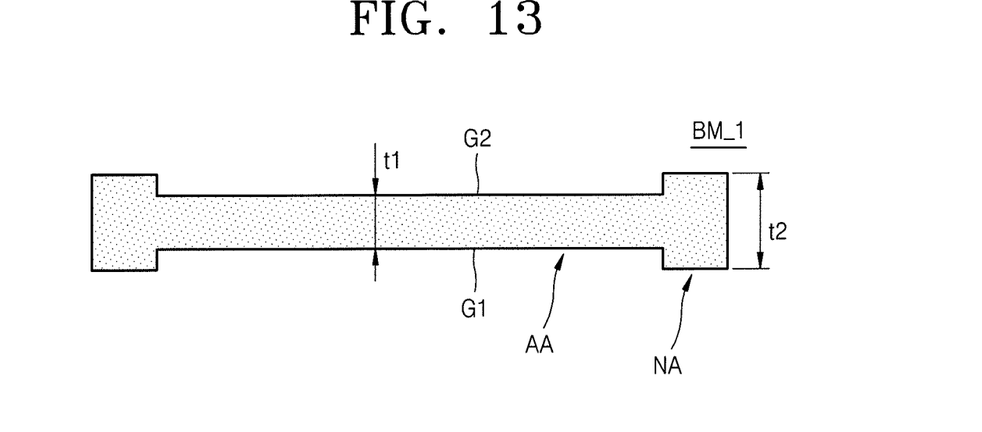

For example, as illustrated in FIG. 5, after the first mask base substrate BM_1 and the second mask base substrate BM_2 are each separated from the adhesive layer AL, the first mask base substrate BM_1 with the first stepped groove G1 and the second stepped groove G2 thereon as shown in FIG. 13 may be manufactured by using a method of manufacturing the mask for deposition illustrated in connection with FIGS. 10 to 17. A mask for deposition FMM, in which the pattern hole PH is formed in the effective area AA of the first mask base substrate BM_1 with the first stepped groove G1 and the second stepped groove G2 thereon may be manufactured. Hereinafter, the process for forming the second stepped groove G2 and the pattern hole PH will be described in detail.

Figure 10:
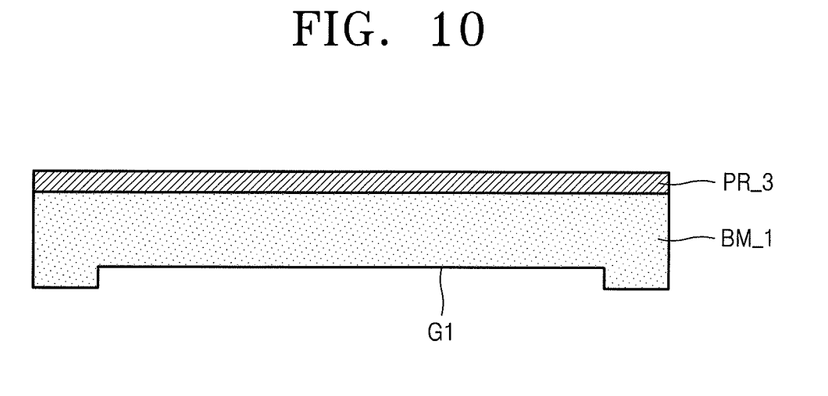
FIGS. 10 to 17 illustrate conceptual diagrams for explaining a method of manufacturing a mask for deposition according to another embodiment.

Referring to FIG. 10, a third photoresist layer PR_3 may be formed on the bottom surface of the first mask base substrate BM_1 opposite to the top surface of the first mask base substrate BM_1 with the first stepped groove G1 thereon. Here, even in the case of the second mask base substrate BM_2, the second stepped groove G2 and the pattern hole PH may be formed according to the method of manufacturing the mask for deposition explained in connection with FIGS. 10 to 17. However, the process performed on the second mask base substrate BM_2 may be the same as that performed on the first mask base substrate BM_1. Thus, hereinafter, for convenience of description, only process performed on the first mask base substrate BM_1 will be described in detail.

Figure 11:
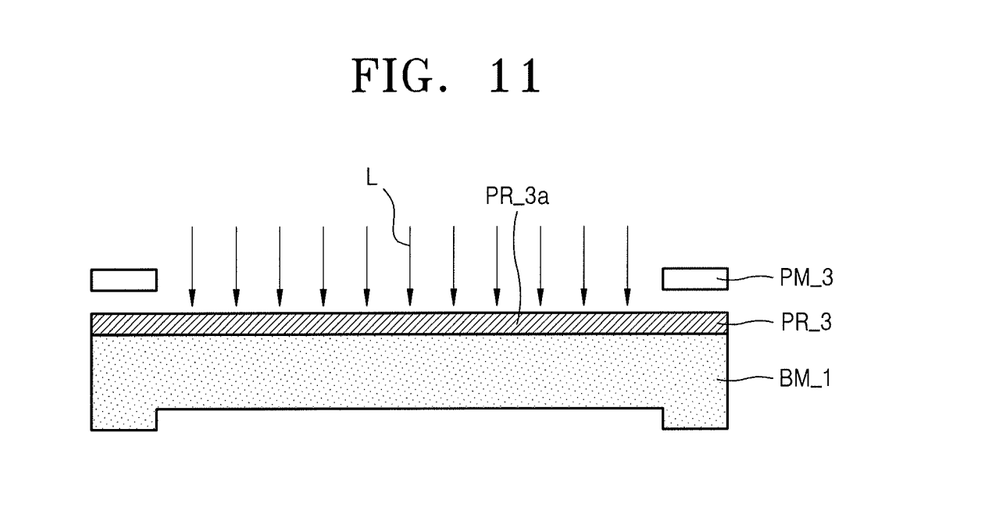

Referring to FIG. 11, a third photomask PM_3 may be arranged over the third photoresist layer PR_3 formed on the bottom surface of the first mask base substrate BM_1. As an example, the third photoresist layer PR-3 may be a positive photoresist layer. The third photomask PM_3 may have an opening corresponding to the effective area AA of the first mask base substrate BM_1 on which the second stepped groove (see G2 in FIG. 13) is to be formed. Light may be irradiated onto a third development area PR_3a of the third photoresist layer PR_3 through an opening of the third photomask PM_3. Light irradiated toward the third photoresist layer PR_3 formed on the non-effective area NA of the first mask base substrate BM_1 may be shielded by the third photomask PM_3 such that the non-effective area NA is not exposed.

Referring to FIG. 12, the third development area PR_3a of the third photoresist layer PR_3, which has been exposed, may be removed. Referring to FIG. 13, the effective area AA of the bottom surface of the first mask base substrate BM_1, which was not covered by the third photoresist layer PR_3, may be etched. Accordingly, the second stepped groove G2 may be formed on the bottom surface of the first mask base substrate BM_1. As a result, the first mask base substrate BM_1 may include the first stepped groove G1 formed on the top surface of the first mask base substrate BM_1 and the second stepped groove G2 formed on the bottom surface of the first mask base substrate BM_1. In this case, the effective area AA of the first mask base substrate BM_1 may have the first thickness t1, and the non-effective area NA of the first mask base substrate BM_1, where the first stepped groove G1 and the second stepped groove G2 are not formed, may have the second thickness t2 greater than the first thickness t1.

Figure 14:
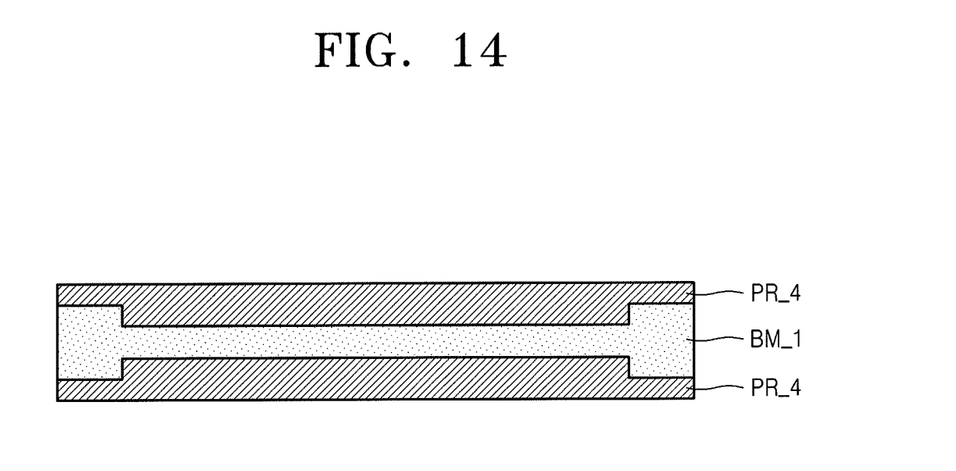

Referring to FIG. 14, a fourth photoresist layer PR_4 may be formed on each of the top surface of the first mask base substrate BM_1 on which the first stepped groove G1 is formed and the bottom surface of the first mask base substrate BM_1 on which the second stepped groove G2 is formed.

Figure 15:
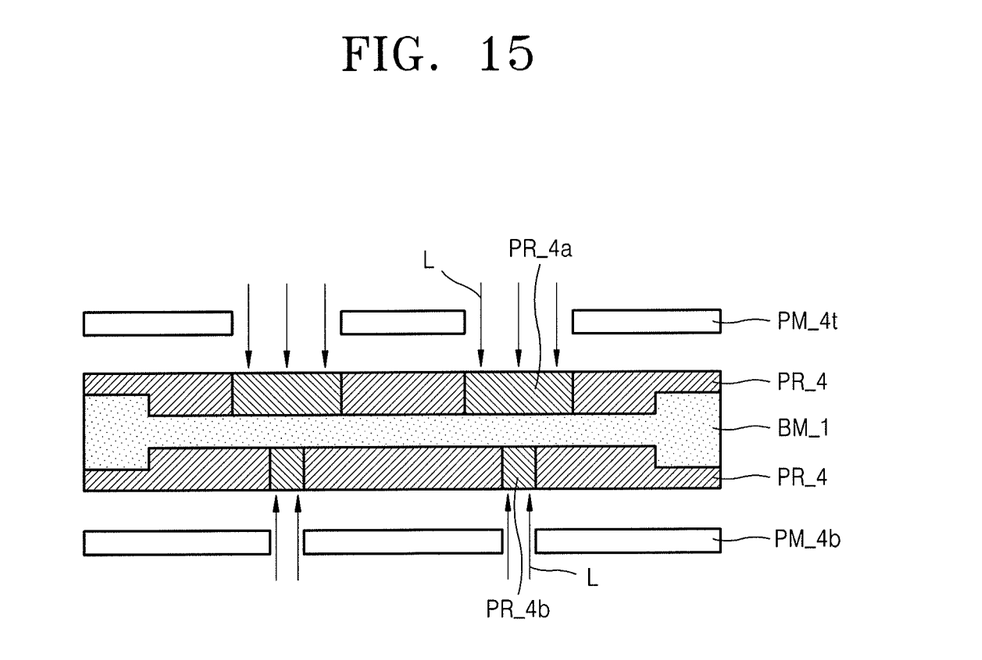

Referring to FIG. 15, a fourth photomask PM_4t or PM_4b may be arranged over the fourth photoresist layer PR_4 and light may be irradiated to a fourth development area PR_4a or PR_4b of the fourth photoresist layer PR_4. The fourth photomask PM_4t or PM_4b may include a plurality of openings corresponding to positions of pattern holes to be formed in the first mask base substrate BM_1. Light irradiated toward the fourth photoresist layer PR_4 may be irradiated onto the fourth development area PR_4a or PR_4b of the fourth photoresist layer PR_4 through the openings formed in the fourth photomask PM_4t or PM_4b. Light irradiated to a portion of the fourth photoresist layer PR_4 located on the remaining area of the fourth photoresist layer PR_4 other than the fourth development area PR_4a or PR_4b, for example, a portion of the fourth photoresist layer PR_4 over the non-effective area NA of the first mask base substrate BM_1, may be shielded by the fourth photomask PM_4t or PM_4b.

Referring to FIG. 15, a width of the fourth development area PR_4a of the fourth photoresist layer PR_4 on the top surface of the first mask base substrate BM_1 may be greater than a width of the fourth development area PR_4b of the fourth photoresist layer PR_4 under the bottom surface of the first mask base substrate BM_1. For example, a structure having this cross-section may be used in a wet etching process to form the pattern hole PH t in the first mask base substrate BM_1 to have a tapered shape.

Figure 16:
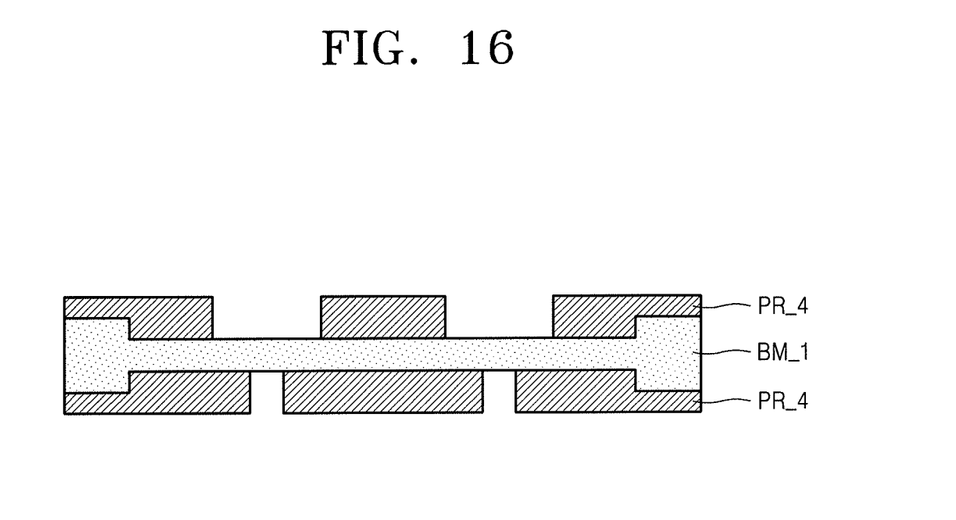

Referring to FIG. 16, the fourth development area PR_4a or PR_4b of the fourth photoresist layer PR_4 that has been exposed, is developed. In this state, a portion of the effective area AA of the first mask base substrate BM_1 not covered by the fourth photoresist layer PR_4 may be etched by a wet etching process and formed into the pattern hole PH as shown in FIG. 17.

According to the method of manufacturing a mask for deposition according to an embodiment as described above, a mask for deposition FMM including the effective area AA having the first thickness t1 and the non-effective area NA having the second thickness t2 may be formed. Herein, the thickness of the effective area AA of the first mask base substrate BM_1, on which the first stepped groove G1 and the second stepped groove G2 is formed, may be in a range of about 5 μm to about 20 μm, and the thickness of the non-effective area NA of the first mask base substrate BM_1 may be in a range of about 20 μm to about 50 μm.

For example, the effective area AA of the mask for deposition FMM in which the pattern hole PH, through which a deposition material passes during the deposition process, may be formed to have a smaller thickness than a non-effective area NA such that a high-quality display may be realized and a shadow phenomenon may be reduced. The non-effective area NA of the mask for deposition FMM may be formed to have a greater thickness than the effective area AA to ensure mechanical strength when the mask for deposition is welded onto a frame.

Figure 17:
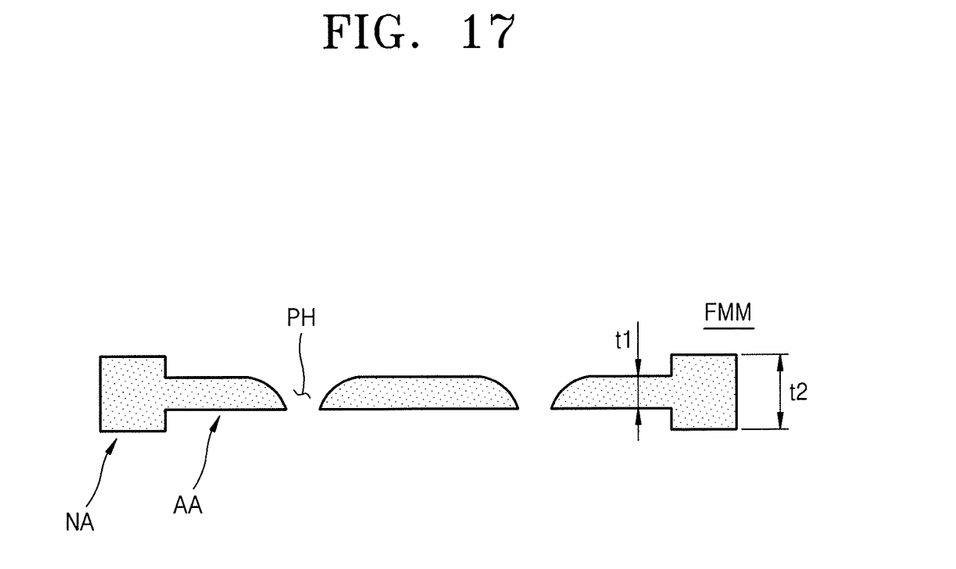

FIGS. 9 and 17 illustrate examples of the mask for deposition FMM manufactured according to a method of manufacturing a mask for deposition according to embodiments described with reference to the drawings.

Regarding the masks for deposition FMM shown in FIGS. 9 and 17, for convenience of description a total of two pattern holes PH are shown as being formed in the effective area AA. According to various implementations, a plurality of predetermined patterns may be formed in the effective area AA of the mask for deposition FMM. In a deposition process in which a deposition material is deposited on a substrate of a display device by using the mask for deposition FMM, pattern holes PH may allow the deposition material to be deposited on the substrate of the display device in the same pattern as the pattern of the pattern holes PH.

In some implementations, the effective area AA of the mask for deposition FMM may be referred to as a pattern portion, and the non-effective area NA may be referred to as a supporting portion. In this regard, the supporting portion may be formed as an extension from facing side surfaces of the pattern portion. The supporting portion may include a reinforcement portion RM protruding upwardly or downwardly with respect to a plane formed by a top surface and a bottom surface of the pattern portion.

For example, the embodiment shown in FIG. 9 illustrates a case where the reinforcement portion RM protrudes upwardly with reference to the top surface of the pattern portion, and the embodiment shown in FIG. 17 illustrates a case where the reinforcement portion RM protrudes upwardly with reference to the top surface of the pattern portion and downwardly with reference to the bottom surface of the pattern portion.

In these embodiments, the second thickness t2 of the supporting portion may be greater than the first thickness t1 of the pattern portion. For example, the thickness of the pattern portion may be in a range of about 5 μm to about 20 μm, and the thickness of the supporting portion may be in a range of about 20 μm to about 50 μm.

By way of summation and review, organic light emitting devices may have a structure in which a first electrode, an organic layer, and a second electrode are sequentially stacked in this stated order on a substrate. This stacked structure of such organic light emitting devices may be formed by a deposition method using a mask. For example, a fine pattern of the organic layer may be formed by using a deposition method using a metal mask such as a fine metal mask (FMM).

One or more embodiments provide a method of manufacturing a mask for deposition, the method providing a simplified process with high productivity.

One or more embodiments include a mask for deposition, the mask having mechanical strength obtained by forming an effective area in a smaller thickness and a non-effective area in a greater thickness.

By using the mask for deposition FMM according to an embodiment as described above, the effective area AA of the mask for deposition FMM in which the pattern hole PH, through which a deposition material passes during the deposition process, is formed in a smaller thickness in order to allow a high-quality display to be realized and to reduce the shadow phenomenon. The non-effective area NA of the mask for deposition FMM may be formed to have a greater thickness than the effective area NA to ensure the mechanical strength when the mask for deposition is welded to a frame.

A mask for deposition and a method of manufacturing the same according to embodiments provide a simplified process with high productivity.

Also, an effective portion of the mask where a pattern hole may be formed to have a relatively smaller thickness, and a non-effective portion of the mask to be welded to a frame may be formed to have a relatively greater thickness, thereby increasing a mechanical strength of the mask.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A method of manufacturing a mask for deposition, the method comprising:

attaching a bottom surface of a first mask base substrate to a top surface of an adhesive layer and attaching a top surface of a second mask base substrate to a bottom surface of the adhesive layer;
forming a first photoresist layer on a top surface of the first mask base substrate and on a bottom surface of the second mask base substrate;
exposing and developing the first photoresist layer to remove a portion of the first photoresist layer on an effective area located in a center of the top surface of the first mask base substrate and in a center of the bottom surface of the second mask base substrate, while allowing a portion of the first photoresist layer on a non-effective area at an edge of the top surface of the first mask base substrate and at an edge of the bottom surface of the second mask base substrate to remain;
etching the effective area to form a first stepped groove on the top surface of the first mask base substrate and on the bottom surface of the second mask base substrate;
removing the portion of the first photoresist layer remaining on the non-effective area;
separating the first mask base substrate and the second mask base substrate from the adhesive layer; and
after separating the first mask base substrate and the second mask base substrate from the adhesive layer, forming a pattern hole in the effective area of each of the first mask base substrate and the second mask base substrate, each with the first stepped groove thereon.

2. The method as claimed in claim 1, wherein:
the adhesive layer includes at least one selected from a resin adhesive, a resin-free adhesive, a silicone adhesive, an acrylic adhesive, a plastic adhesive, a natural adhesive, a water-based adhesive, and a waterproof adhesive.

3. The method as claimed in claim 1, wherein:
the first photoresist layer includes a positive-type photoresist.

4. The method as claimed in claim 3, wherein exposing the first photoresist layer includes:
arranging a first photomask over the first photoresist layer, wherein the first photomask has an opening corresponding to the effective area of each of the first mask base substrate and the second mask base substrate, and
irradiating light toward each of the first mask base substrate and the second mask base substrate through the opening of the first photomask, such that light passing through the opening of the first photomask is irradiated onto the first photoresist layer on the effective area of each of the top surface of the first mask base substrate and the bottom surface of the second mask base substrate, and light traveling toward the first photoresist layer located on the non-effective area of each of the top surface of the first mask base substrate and the bottom surface of the second mask base substrate is shielded by the first photomask.

5. The method as claimed in claim 1, wherein:
the first photoresist layer includes a negative-type photoresist.

6. The method as claimed in claim 5, wherein exposing the first photoresist layer includes:
arranging a first photomask over the first photoresist layer such that the first photomask has an opening corresponding to the non-effective area of each of the first mask base substrate and the second mask base substrate, and
irradiating light toward each of the first mask base substrate and the second mask base substrate through the first photomask, such that light passing through the opening of the first photomask is irradiated onto the first photoresist layer located on the non-effective area of each of the top surface of the first mask base substrate and the bottom surface of the second mask base substrate, and light traveling toward the first photoresist layer located on the effective area of each of the top surface of the first mask base substrate and the bottom surface of the second mask base substrate is shielded by the first photomask.

7. The method as claimed in claim 1, wherein:
the pattern hole is formed by wet-etching or by irradiating with a laser beam.

8. The method as claimed in claim 1, wherein:
a thickness of the effective area of each of the first mask base substrate and the second mask base substrate, each with the first stepped groove thereon, is in a range of about 5 μm to about 20 μm, and
a thickness of the non-effective area of each of the first mask base substrate and the second mask base substrate is in a range of about 20 μm to about 50 μm.

9. A method of manufacturing a mask for deposition, the method comprising:
attaching a bottom surface of a first mask base substrate onto a top surface of an adhesive layer and attaching a top surface of a second mask base substrate onto a bottom surface of the adhesive layer;
forming a first photoresist layer on each of a top surface of the first mask base substrate and a bottom surface of the second mask base substrate;
exposing and developing the first photoresist layer to remove a portion of the first photoresist layer on an effective area located in a center of each of the top surface of the first mask base substrate and the bottom surface of the second mask base substrate, while allowing a portion of the first photoresist layer on a non-effective area, other than the effective area, to remain near an edge of each of the top surface of the first mask base substrate and the bottom surface of the second mask base substrate;
etching the effective area to form a first stepped groove in each of the top surface of the first mask base substrate and the bottom surface of the second mask base substrate;
removing the portion of the first photoresist layer remaining on the non-effective area;
separating the first mask base substrate and the second mask base substrate from the adhesive layer;
after separating the first mask base substrate and the second mask base substrate from the adhesive layer, forming a second photoresist layer on each of the bottom surface of the first mask base substrate and the top surface of the second mask base substrate;
exposing and developing the second photoresist layer to remove a portion of the second photoresist layer on an effective area located in a center of each of the bottom surface of the first mask base substrate and the top surface of the second mask base substrate, while allowing a portion of the second photoresist layer on a non-effective area, other than the effective area, to remain near an edge of the bottom surface of the first mask base substrate and the top surface of the second mask base substrate;
etching the effective area to form a second stepped groove on each of the bottom surface of the first mask base substrate and the top surface of the second mask base substrate;

removing the portion of the second photoresist layer remaining on the non-effective area; and forming a pattern hole in the effective area of each of the first mask base substrate having the first stepped groove thereon and the second mask base substrate having the second stepped groove thereon.

10. The method as claimed in claim 9, wherein
the adhesive layer includes at least one selected from a resin adhesive, a resin-free adhesive, a silicone adhesive, an acrylic adhesive, a plastic adhesive, a natural adhesive, a water-based adhesive, and a waterproof adhesive.

11. The method as claimed in claim 9, wherein
the first photoresist layer includes a positive-type photoresist.

12. The method as claimed in claim 11, wherein exposing the first photoresist layer includes:
arranging a first photomask over the first photoresist layer, such that the first photomask has an opening corresponding to the effective area of each of the first mask base substrate and the second mask base substrate, and irradiating light toward each of the first mask base substrate and the second mask base substrate through the first photomask, wherein light passing through the opening of the first photomask is irradiated onto the first photoresist layer on the effective area of each of the top surface of the first mask base substrate and the bottom surface of the second mask base substrate, and light traveling toward the first photoresist layer on the non-effective area of each of the top surface of the first mask base substrate and the bottom surface of the second mask base substrate is shielded by the first photomask.

13. The method as claimed in claim 9, wherein:
the first photoresist layer includes a negative-type photoresist.

14. The method as claimed in claim 13, wherein exposing the first photoresist layer includes:
arranging a first photomask over the first photoresist layer, such that the first photomask has an opening corresponding to the non-effective area of each of the first mask base substrate and the second mask base substrate, and irradiating light toward each of the first mask base substrate and the second mask base substrate through the first photomask, such that light passing through the opening of the first photomask is irradiated onto the first photoresist layer on the non-effective area of each of the top surface of the first mask base substrate and the bottom surface of the second mask base substrate, and light traveling toward the first photoresist layer on the effective area of each of the top surface of the first mask base substrate and the bottom surface of the second mask base substrate is shielded by the first photomask.

15. The method as claimed in claim 9, wherein:
the pattern hole is formed by wet-etching or by irradiating with a laser beam.

16. The method as claimed in claim 9, wherein
a thickness of the effective area of each of the first mask base substrate and the second mask base substrate, each with the first stepped groove and the second stepped groove thereon, is in a range of about 5 µm to about 20 µm, and
a thickness of the non-effective area of each of the first mask base substrate and the second mask base substrate is in a range of about 20 µm to about 50 µm.

17. A mask for deposition, the mask comprising:
a pattern portion including a plurality of pattern holes through which a deposition material is passable; and
a supporting portion extending outwardly from facing sides of the pattern portion,
wherein the supporting portion includes a reinforcing portion protruding both upward and downward with respect to a plane formed by top and bottom surfaces of the pattern portion.

18. The mask as claimed in claim 17, wherein:
a thickness of the supporting portion is greater than a thickness of the pattern portion.

19. The mask as claimed in claim 17, wherein:
a thickness of the pattern portion is in a range from about 5 µm to about 20 µm.

20. The mask as claimed in claim 17, wherein:
a thickness of the supporting portion is in a range from about 20 µm to about 50 µm.

* * * * *